US009433081B1

(12) United States Patent
Xiong et al.

(10) Patent No.: US 9,433,081 B1
(45) Date of Patent: Aug. 30, 2016

(54) DIFFERENTIAL SIGNAL CROSSTALK MINIMIZATION FOR DUAL STRIPLINE

(71) Applicant: Cisco Technology, Inc., San Jose, CA (US)

(72) Inventors: Yongming Xiong, Fremont, CA (US); Lin Shen, Saratoga, CA (US); Shahbaz Mahmood, San Jose, CA (US)

(73) Assignee: CISCO TECHNOLOGY, INC, San Jose, CA (US)

( * ) Notice: Subject to any disclaimer, the term of this patent is extended or adjusted under 35 U.S.C. 154(b) by 0 days.

(21) Appl. No.: 14/464,129

(22) Filed: Aug. 20, 2014

Related U.S. Application Data (60) Provisional application No. 61/900,378, filed on Nov. 5, 2013.

(51) Int. Cl.
| | | |
|---|---|---|
| *G06F 17/50* | (2006.01) | |
| *H05K 1/02* | (2006.01) | |
| *H05K 1/11* | (2006.01) | |
| *H05K 1/16* | (2006.01) | |

(52) U.S. Cl.
CPC .......... *H05K 1/0245* (2013.01); *H05K 1/0216* (2013.01); *H05K 1/115* (2013.01); *H05K 1/16* (2013.01)

(58) Field of Classification Search
CPC .... H04B 15/00; H04B 1/719; H04L 25/0272
USPC .......................................................... 716/137
See application file for complete search history.

(56) References Cited

U.S. PATENT DOCUMENTS

| | | | | |
|---|---|---|---|---|
| 5,801,597 | A * | 9/1998 | Carter et al. | 333/12 |
| 6,388,208 | B1 * | 5/2002 | Kiani et al. | 174/266 |
| 6,486,405 | B2 * | 11/2002 | Lin | H01B 11/005 |
| | | | | 174/113 R |
| 7,002,430 | B2 * | 2/2006 | Benham et al. | 333/24 R |
| 7,232,959 | B2 * | 6/2007 | Hsu | H05K 1/0228 |
| | | | | 174/113 R |
| 7,249,337 | B2 * | 7/2007 | Gisin et al. | 716/115 |
| 7,397,320 | B1 * | 7/2008 | Bokhari | 333/1 |
| 7,448,880 | B2 * | 11/2008 | Osaka | 439/74 |
| 8,283,991 | B1 * | 10/2012 | Essenwanger | 333/26 |
| 8,624,688 | B2 * | 1/2014 | Essenwanger | 333/26 |
| 2011/0203843 | A1 * | 8/2011 | Kushta | 174/377 |
| 2013/0162364 | A1 * | 6/2013 | Lin | 333/5 |
| 2014/0236512 | A1 * | 8/2014 | Yan | 702/65 |

* cited by examiner

*Primary Examiner* — Sun Lin
(74) *Attorney, Agent, or Firm* — Polsinelli PC (57) ABSTRACT

The subject technology provides configurations for a printed circuit board that includes a first reference plane, a first signal layer below the first reference plane, a second signal layer below the first signal layer, a second reference plane below the second signal layer, a first differential pair on the first signal layer, and a second differential pair on the second signal layer, each of the first and second differential pairs comprising, respectively, a first pair and a second pair of conductive traces formed on a dielectric material of the PCB, the first pair of conductive traces being arranged on the dielectric material to interleave with the second pair of conductive traces.

19 Claims, 6 Drawing Sheets

| Layer Name | Original design | |
|---|---|---|
| | Build - up | Dielectric thickness (unit mil) |
| COMP | 0.5oz plating | |
| | PP | 3.9 |
| L2 | 0.5oz | |
| | CORE | 5 |
| L3 | 0.5oz | |
| | PP | 19 |
| L4 | 0.5oz | |
| | CORE | 5 |
| L5 | 0.5oz | |
| | PP | 5.2 |
| L6 | 1oz | |
| | CORE | 21 |
| L7 | 1oz | |
| | PP | 5.2 |
| L8 | 0.5oz | |
| | CORE | 5 |
| L9 | 0.5oz | |
| | PP | 19 |
| L10 | 0.5oz | |
| | CORE | 5 |
| L11 | 0.5oz | |
| | PP | 3.9 |
| SOLD | 0.5oz plating | |

DIFFERENTIAL SIGNAL CROSSTALK MINIMIZATION FOR DUAL STRIPLINE

CLAIM TO PRIORITY

This application claims priority to U.S. provisional application No. 61/900,378, filed on Nov. 5, 2013, which is expressly incorporated by reference herein in its entirety.

TECHNICAL FIELD

The present technology pertains to PCB layout configurations, and more specifically pertains to configurations of differential pairs in a PCB and IC Package.

BACKGROUND

Computer system, networking systems and electronic systems are getting more and more complicated nowadays. The routing density of a PCB and IC Package of these systems become higher and higher due to the complexity, cost competition and physical size limitation(s). Additionally, the speed of electrical interfaces in such systems has increased higher and higher. The crosstalk (e.g., XTALK) of high speed differential pairs in the PCB and IC Package has become an obstacle to routing density and performance.

As electronic systems, computer and networking systems get more and more complicated and the interfaces in the systems run faster, the high speed differential interfaces routing density of a PCB and IC Package become much higher because the limited available routing space and routing layers due to the cost and physical size limitation(s). In some cases, the amount of differential pairs cannot be routed in the PCB or IC Package or in certain areas such as a BGA or connector pin field. Further, the crosstalk (XTALK) has become more significant due to an increase of speed and density.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DESCRIPTION OF EXAMPLE EMBODIMENTS

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Overview

The subject technology provides embodiments for a PCB, the PCB including: a first reference plane; a first signal layer below the first reference plane; a second signal layer below the first signal layer; a second reference plane below the second signal layer; a first differential pair on the first signal layer; and a second differential pair on the second signal layer, each of the first and second differential pairs comprising, respectively, a first pair and a second pair of conductive traces formed on a dielectric material of the PCB, the first pair of conductive traces being arranged on the dielectric material to interleave with the second pair of conductive traces.

DESCRIPTION

The disclosed technology addresses the need in the art for achieving a minimum level of crosstalk (e.g., "XTALK" as referred to hereinafter) between high speed differential pairs on a printed circuit board (PCB) but increases routing density by a significant value or percentage. The subject technology therefore provides embodiments for potentially lowering the cost for manufacturing PCBs by increasing the routing density for a given PCB board. As used herein, the phrase "differential pair" refers to a way for implementing differential signaling for transmitting information electrically with two complementary signals sent on two paired wires (e.g., a differential pair).

By using a dual stripline structure, carefully designed edge coupled differential pairs and interleaved pair to pair spacing based on a PCB stackup, the XTALK noise from an aggressor differential pair will be balanced on the two conductor traces of a victim differential pair. As used herein, the term "stripline" refers to, in the context of a circuit, a use of a flat strip of metal which is sandwiched between two parallel ground ("reference") planes. In some examples, the balanced XTALK noise may be seen as common mode noise to the victim differential pair. Consequently, the balanced XTALK noise therefore may be cancelled by the differential receiver. As a result, a minimum XTALK level may be achieved while taking a lesser percentage or amount of the routing space as typically required before.

By carefully staggering the arrangement of the dual stripline differential pairs based on the PCB stackup, XTALK noise can be cancelled while also achieving high density routing. By implementing a purposely designed differential pair to pair spacing in conjunction with a carefully designed dual stripline structure, the subject technology can take advantage of XTALK balancing and cancelation technique described below to achieve high density routing while maintaining the minimized XTALK noise level.

Minimizing the XTALK of Differential Pairs

The XTALK between interconnects of differential pairs of a PCB and package can be represented as near-end crosstalk (NEXT) and far-end crosstalk (FEXT). The NEXT may be quantified by a backward crosstalk coefficient $K_b$ as shown below, and the FEXT may be calculated by the forward crosstalk coefficient $K_f$ as shown below:

$$K_b = \frac{1}{4\sqrt{L_s C_s}} \left\{ \frac{L_M}{Z_0} + Z_0 C_M \right\}$$

$$K_f = -\frac{1}{2} \left\{ \frac{L_M}{Z_0} - Z_0 C_M \right\}$$

$$Z_o = \sqrt{\frac{L_s}{C_s}}$$

$$V_b = K_b * V_{aggressor}$$

$$V_f = K_f * L * dV/dt$$

The NEXT and FEXT are both proportional to its crosstalk coefficient Kb and Kf respectively. $C_M$ (nF/cm) is the mutual capacitance per unit length between two lines and $L_M$ (nH/cm) mutual inductance per unit length between two lines $L_M$ (nH/cm). FEXT is also proportional to the coupled trace length. $L_s$ and $C_s$ represent the self-inductance and self-capacitance per unit length of the line, respectively.

In a homogeneous environment such as in a stripline structure, the total FEXTs is almost zero (0) because the XTALK due to the mutual capacitance and the XTALK due to the mutual inductance are each approximately equal in magnitude but in opposite polarity. In at least one embodiment, the sum of the two crosstalks are zero.

In some cases, the total FEXT is very small in the stripline structure. The XTALK noise balancing and cancellation discussion below is focused on the NEXT.

In some examples, a way to reduce the XTALK from differential pairs for a stripline structure is to increase the spacing between one pair to another pair so as to reduce the coupling. In a given high density PCB design, sometimes it may be difficult to implement this type of approach. Thus, it may be desirable to provide another technique to reduce the XTALK instead of purely increasing the pair to pair spacing in order to minimize the XTALK level. In this regard, the subject technology provides a XTALK balancing and cancellation technique while keeping tightly pair to pair spacing (e.g., spacing between one differential pair to another differential pair) in a dual stripline structure.

Figure 1:
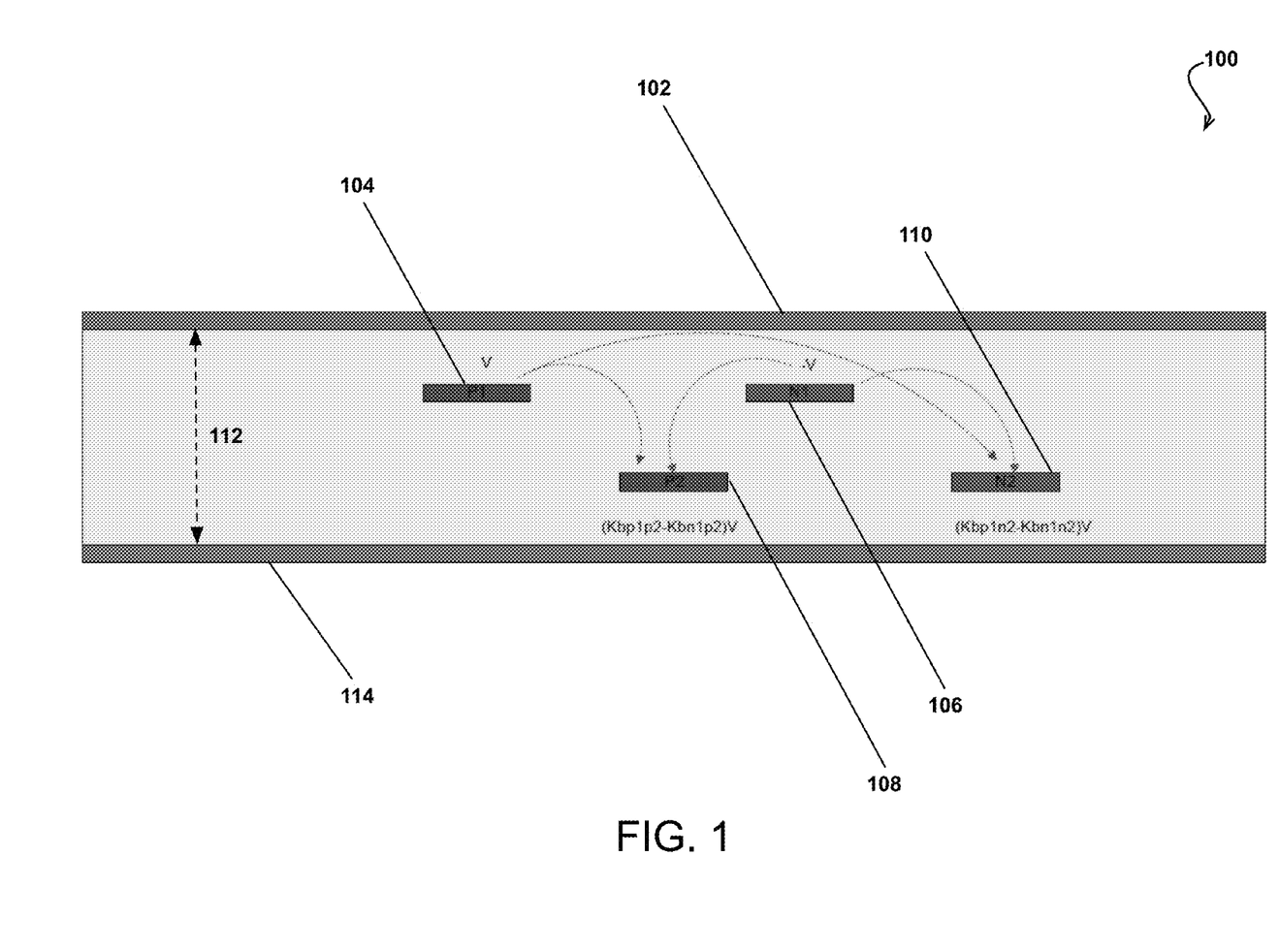
FIG. 1 illustrates an example dual stripline structure of two differential pairs.

FIG. 1 illustrates an example dual stripline structure 100 in accordance with some embodiments of the subject technology. The dual stripline structure 100 may be provided in a PCB, arranged as illustrated in FIG. 1, as further discussed below.

As shown in FIG. 1, a differential pair P1N1 including conductive traces 104 and 106 may be included on a signal layer below a reference plane 102 (e.g., ground plane). A second differential pair P2N2 including conductive traces 108 and 110 are also provided by the PCB of the dual stripline structure. In the example of FIG. 1, assume the differential pair P1N1 is the "aggressor" differential pair and the differential pair P2N2 is the "victim" differential pair (e.g., subject to XTALK noise from the aggressor). As understood herein, crosstalk may be noise induced by one signal (e.g., an aggressor) that interferes with another signal (e.g., a victim). As further shown in FIG. 1, the switching voltages on the differential pair corresponding to the conductive traces 104 and 106 (P1 and N1) are V in amplitude but in a 180 degree phase relationship. Further, the following notation may represent different crosstalk coefficients between respective conductive traces shown in FIG. 1:

Kbp2p1 is the backwards crosstalk coefficient between conductive traces P1 and P2;

Kbp2n1 is the backwards crosstalk coefficient between conductive traces N1 and P2;

Kbp1n2 is the backwards crosstalk coefficient between conductive traces P1 and N2; and Kbn1n2 is the backwards crosstalk coefficient between conductive traces N1 and N2.

In some examples, the XTALK noise on the victim differential pair including conductive traces P2 and N2 can be represented in the below notation:

$$\begin{bmatrix} Vp2 \\ Vn2 \end{bmatrix} = \begin{bmatrix} Kbp1p2 & Kbn1p2 \\ Kbp1n2 & Kbn1n2 \end{bmatrix} \begin{bmatrix} V \\ -V \end{bmatrix}$$

$$kb\text{diff\_}p1n1\_to\_p2n2 = [(Kbp1p2 - Kbn1p2) - (Kbp1n2 - Kbn1n2)]$$

As referred to herein, the phrase "pair to pair offset" refers to a horizontal and/or vertical distance or spacing between two different differential pairs (in which each respective differential pair includes a respective set of conductive traces, typically two traces). In some examples, by controlling the pair to pair offset, the total coupling noise on the conductive trace P2 can be made substantially equal to the total coupling noise on the conductive trace N2. When this occurs, it may be called "XTALK noise balanced" on the conductive trace P2 and the conductive trace N2, which may be represented in the following mathematical notation:

$$Kbp1p2 - Kbn1p2 \approx Kbp1n2 - Kbn1n2$$

As a result of the differential pair common voltage cancellation feature, the total differential XTALK noise from differential pair P1N1 to differential pair P2N2 may be represented as:

$$V\text{diff}_{xtalk_{noise}} = Vp2 - Vn2 \approx 0$$

Or $$Kb\text{diff\_}p1n1\_to\_p2n2 \approx 0$$

In some examples, the value of Kbdiff_p1n1_to_p2n2 is close to 0 when the aggressor differential pair and victim differential pair are arranged on the PCB to interleave each other as shown in FIG. 1. As used herein, the term "interleave" may correspond to the staggered arrangement of respective conductive traces as shown in the example of FIG. 1. In this example, one victim/aggressor conductive trace on a first signal layer is arranged to be between the two aggressor/victim conductive traces on another signal layer of the PCB. One advantage of the arrangement of interleaving respective differential pairs includes reducing an amount of space required on the PCB for the differential pairs while at the same time allowing more routing layers to be able to be included in a PCB stackup of some embodiments described herein.

XTALK Simulation Results

To verify the theory of reduction of XTALK by adjusting the offset of differential pairs in a stripline structure, a few simulation cases were performed as described in further detail below.

Figure 2:
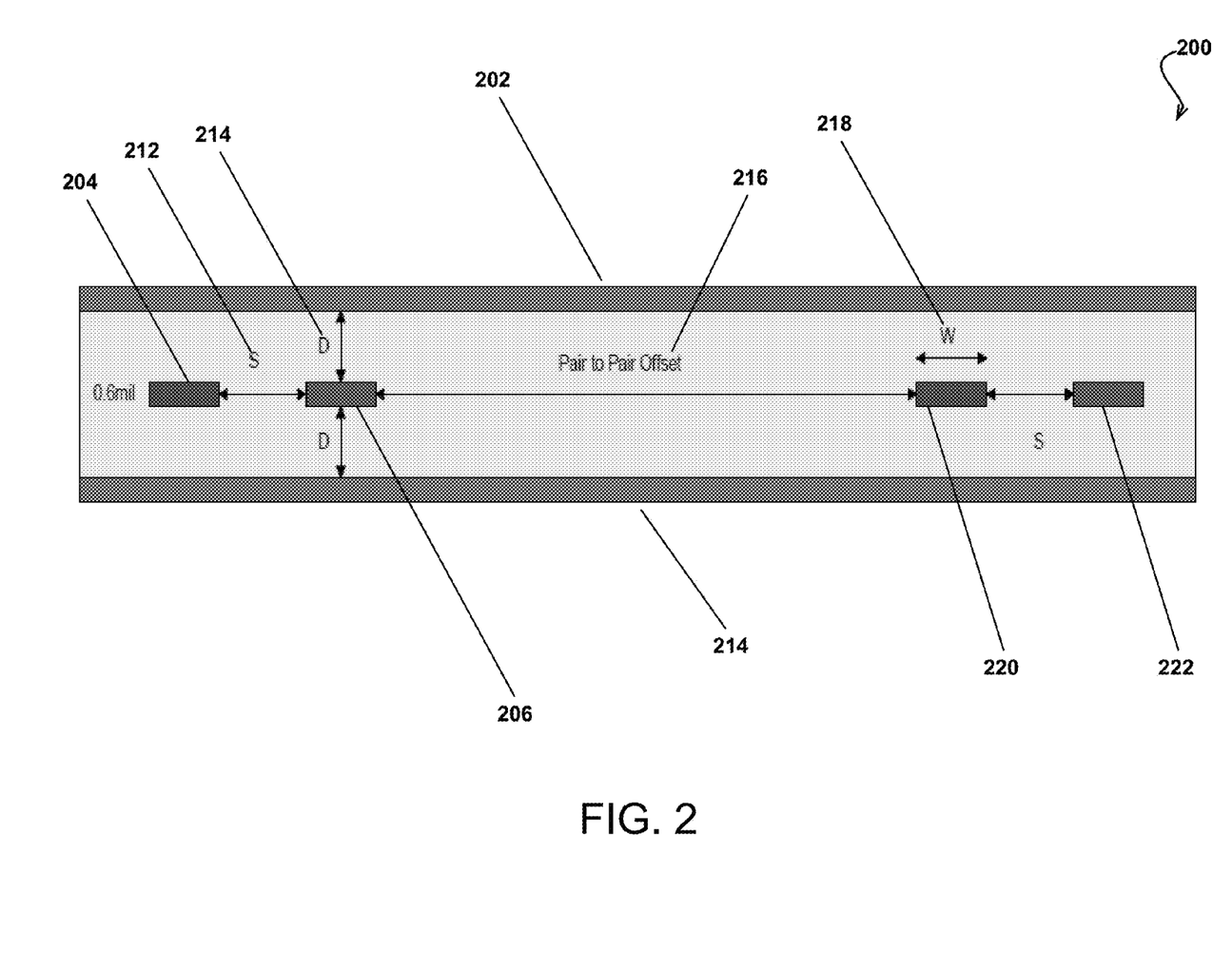
FIG. 2 illustrates an example single stripline structure of two differential pairs.
Figure 3:
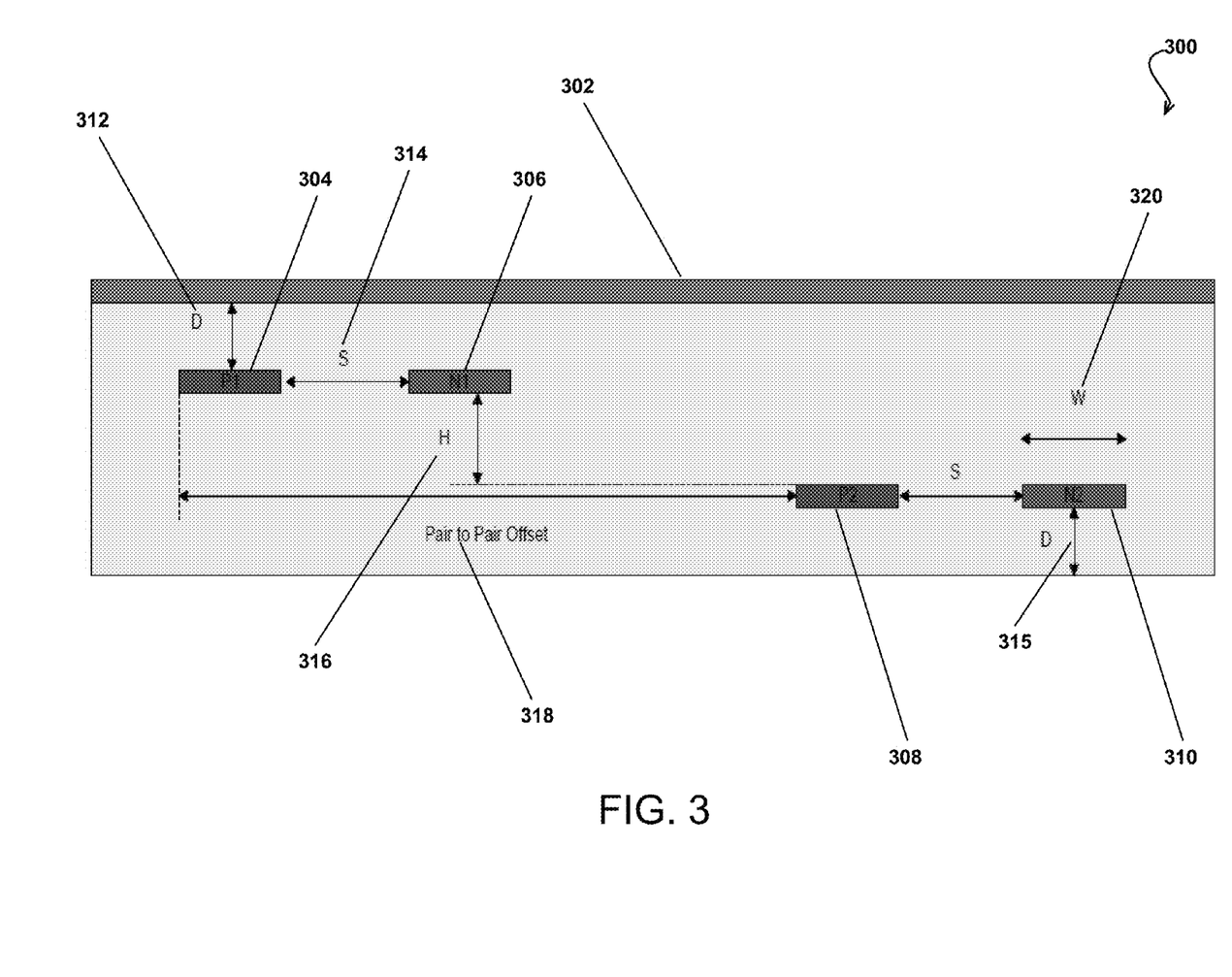
FIG. 3 illustrates an example dual stripline of two differential pair with geometry labels.

FIG. 2 illustrates an example of symmetrical single stripline differential structure 200 and FIG. 3 illustrates an example dual stripline differential structure 300. More specifically, in the examples illustrated, two types of typical 0.5 oz. copper stripline structures were examined in FIG. 2 and FIG. 3, respectively. These copper stripline structures, in some cases, represent single and dual differential pairs, respectively. As illustrated, FIG. 2, has conductive traces 204 and 206 included in a first differential pair, and conductive traces 220 and 222 in a second differential pair. Further, as illustrated in FIG. 3, a first differential pair includes conductive traces 304 and 306 and a second differential pair includes conductive traces 308 and 310.

In FIG. 2, D is a dielectric thickness 214 from trace to its reference plane; W is a trace width 218 (which each of the conductive traces in FIG. 2 also have); S represents a P and N edge to edge space 212 between respective conductive traces of a differential pair, which in this example also separates the two conductive traces of the other differential pair. A pair to pair offset 216 separates the two respective differential pairs. Similarly, in FIG. 3, D is a dielectric thickness 312 from a trace to its reference plane of a first differential pair. Without loss of generality, assume D is a dielectric thickness 315 (that is the same as the dielectric thickness 312) for a second differential pair to its respective reference plane. W is a trace width 320 (which also represents the trace width for each conductive trace in this example); S represents a P and N edge to edge space 314 for the two conductive traces of the first differentia pair (but also for the two conductive traces of the second differential pair). Further, a pair to pair offset 318 separates the two respective differential pairs from a first conductive trace 304 of the first differential pair to a first conductive trace 308 of the second differential pair. H represents a dielectric thickness 316 between the two stripline layers for the two differential pairs.

In some examples, for a given dielectric material, D and W determine the trace's self-impedance. D, W and S determine the differential pair impedance. The ratio of pair to pair offset to D determines the XTALK level between the two coupled differential pairs.

To achieve less than 1% XTALK, the pair to pair offset to D ratio has to be larger than the following numbers corresponding to different stripline structures and geometries, as shown in Table 1 and 2 below. The dielectric material is assumed to be TU862HF with a dielectric constant (Dk) of 4.3 in this example. Generally speaking, in a Dk≈4.3 media stripline structure, one loosely coupled differential pair itself occupies about 4×D routing width. H is the dielectric thickness between two stripline layers.

TABLE 1

1% XTALK of two differential pairs routing area and planes (D = 5 mil, Dk = 4.3, W = 5 mil~6 mil)

| Stripline type | The ratio of H/D | Pair to Pair Offset/D | XTALK (Kb) | Estimated cross-section area of two differential pairs (mil × mil) | Planes per 4 signal routing layers |
|---|---|---|---|---|---|
| Single stripline | 1.0 | 2.29 | 1% | ~52 × 11.8 | 5 |
| Dual stripline | 1.0 | 2.25 | 1% | ~59 × 16.8 | 3 |
|  | 1.5 | 2.1 | 1% | ~59 × 19.3 | 3 |
|  | 2 | 2.2 | 1% | ~58 × 21.8 | 3 |
|  | 3 | 1.9 | 1% | ~57.5 × 26.8 | 3 |

TABLE 2

XTALK of 4 × D separation of two differential pairs and routing area (D = 5 mil, Dk = 4.3, W = 6 mil)

|  | H/D | Pair to Pair Offset/D | XTALK (Kb) | Estimated cross-section area of two differential pairs (mil × mil) |
|---|---|---|---|---|
| Dual Stripline | 1.0 | 4 | 0.2% | ~69 × 16.8 |
|  | 2.0 | 4 | 0.3% | ~68 × 21.8 |
|  | 3.0 | 4 | 0.35% | ~69 × 26.8 |
|  | 4.0 | 4 | 0.35% | ~69 × 31.8 |

From Table 1, it can be seen that to achieve less than 1% of NEXT, dual stripline differential pairs with smaller H/D ratio need be routed with larger ratio of offset/D. In some cases, if keeping the fixed pair to pair offset/D ratio as four, the NEXT will increase for smaller H/D ratio, as shown in Table 2 above.

Figure 4:
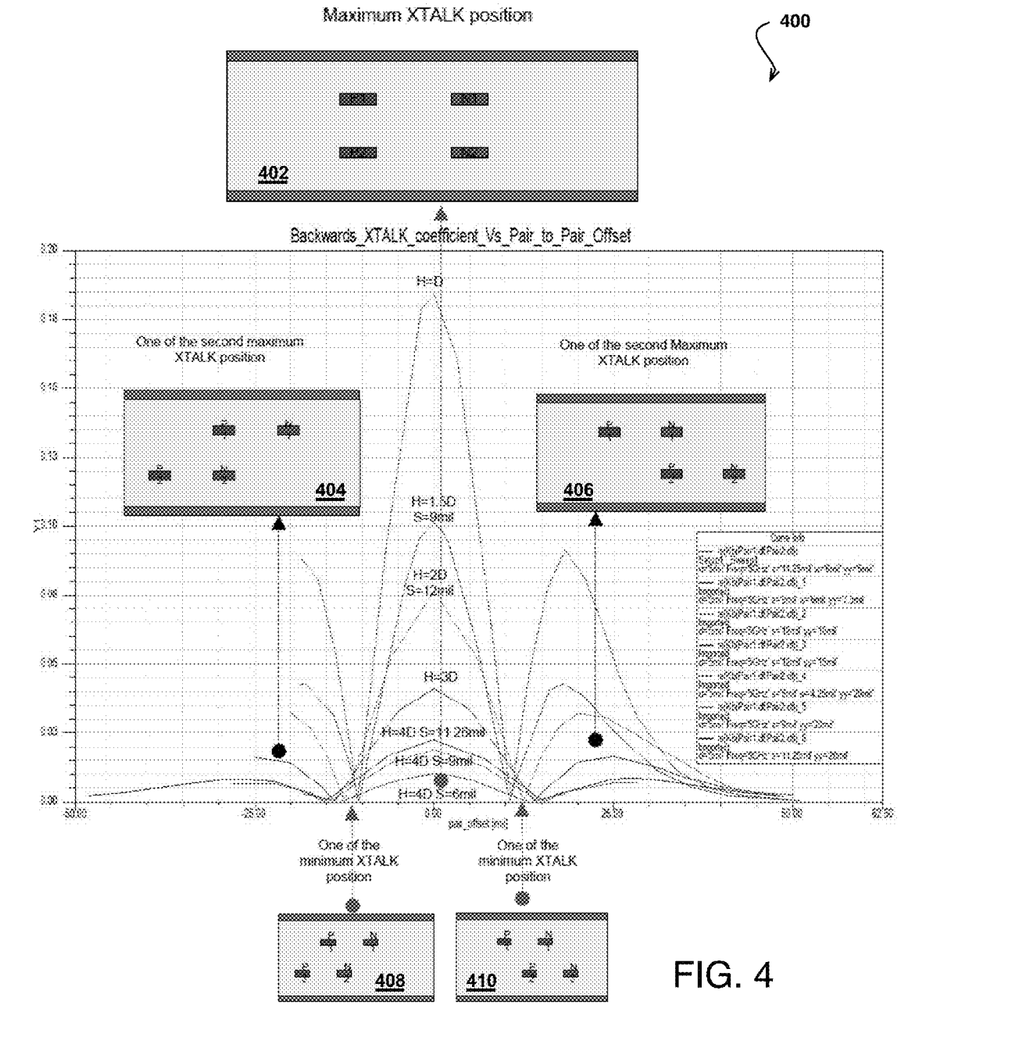
FIG. 4 illustrates an example different pair-to-pair offset among the two differential pairs leading to the maximum and minimum XTALK.

FIG. 4 illustrates an example 400 of different pair-to-pair offsets among the two differential pairs leading to the maximum and minimum XTALK (D=5 mil, Dk=4.3, w=5~6 mil).

More specifically, FIG. 4 shows the relationship of backwards crosstalk coefficient Kb vs. the pair to pair offset at different H/D ratios and different differential pair spacing. The offset values determine whether the Kb peaks or valleys. For instance, the surrounding 5 pair to pair locations are corresponding to the Kb peaks and valleys. When the two pairs are overlapping as illustrated in respective positions 402, 404 and 406, the XTALK reaches to a maximum level; as the pairs are shifting away from each other, the XTALK level is reduced and reaches to the minimum level when the two pairs are interleaved at respective positions 408 and 410. As the two pairs are continuing to shift away, one conductive trace of one differential pair will overlap with another conductive trace of the other differential pair, and the XTALK reaches to a second highest level. As the two pairs keep shifting again, the two pairs pass the interleaving area, and the XTALK level starts to reduce again as the pair to pair offset increases.

The plots shown in FIG. 4 clearly show the interleaved pairs at the two valley locations have the XTALK level as low as the XTALK from two differential pairs with 4× or 5× times D pair to pair spacing. In some cases, the width of the valleys is wider when the dielectric thickness H between the two signal layers is higher. The wider valley therefore is more suitable for a practical application because of the PCB manufacturing tolerance.

In addition, it should be pointed out that the gain of routing space by balancing XTALK and XTALK cancellation is in expense of increasing common mode XTALK and increasing mode conversion. In other words, the common mode impedance and differential impedance will change. Since these are secondary impacts comparing to the differential performance, as long as the differential pairs are loosely coupled, these secondary effects are not significant comparing to differential signal performance improvement.

In summary, the XTALK balancing and cancellation by implementing the interleaved dual stripline, one can achieve the same differential XTALK noise level of conventional 4D separation routing while only use about 0.5×D separation. In some cases, this achieves approximately 50% routing space saving or 50% routing density.

Test Board Configuration

In some examples, a test board may be provided to validate the simulation results of the XTALK of the dual stripline differential pair. Six differential pairs were included in a layout on the dual stripline layers (Layer 9 and Layer 10) with different offset among two pairs, respectively.

Figure 5:
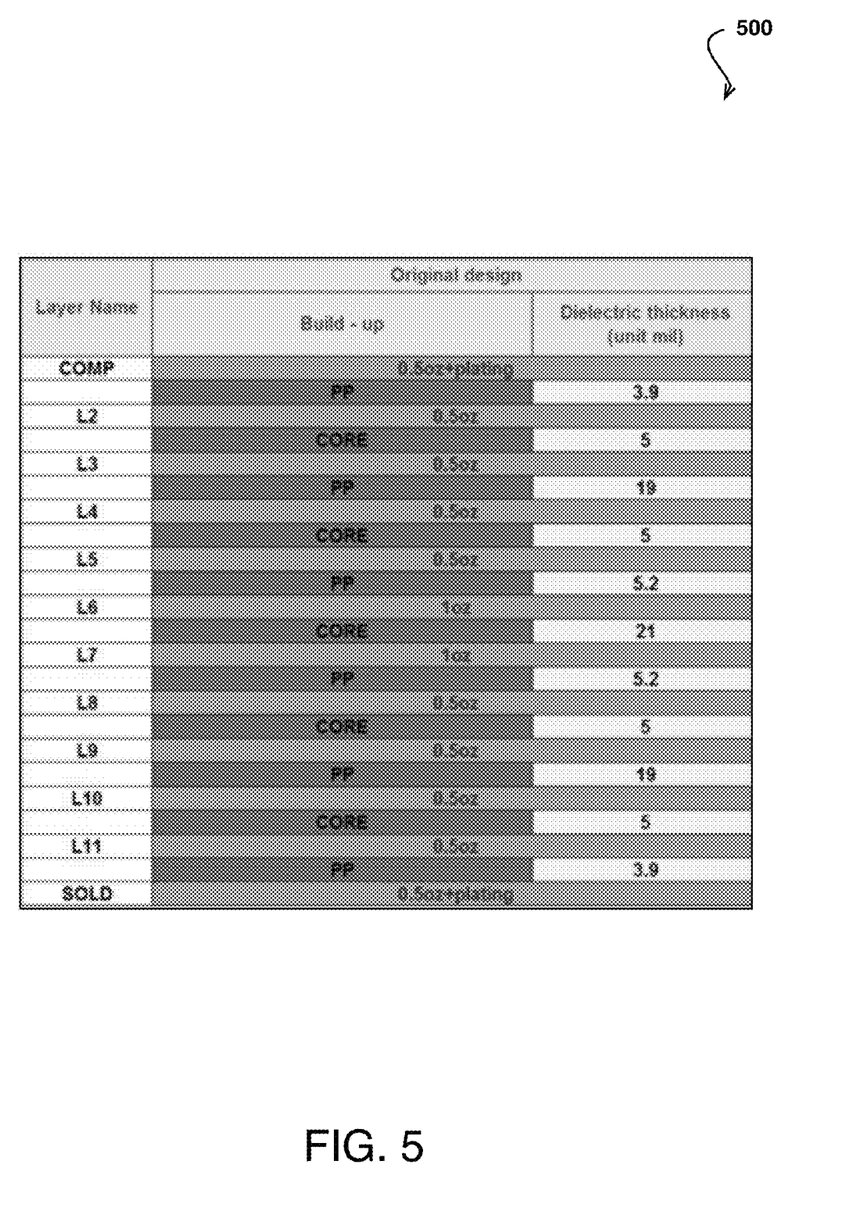
FIG. 5 illustrates an example stackup of a PCB board for testing as listed in a table.

An example stackup of a PCB board for testing is listed in table 500 as illustrated in FIG. 5. Routing layer pair L3 & L4, L6 & L7 and L9 & L10 are used for dual stripline differential routing using the subject technology as disclosed herein.

Example Connector Routing Channel Configuration

Figure 6:
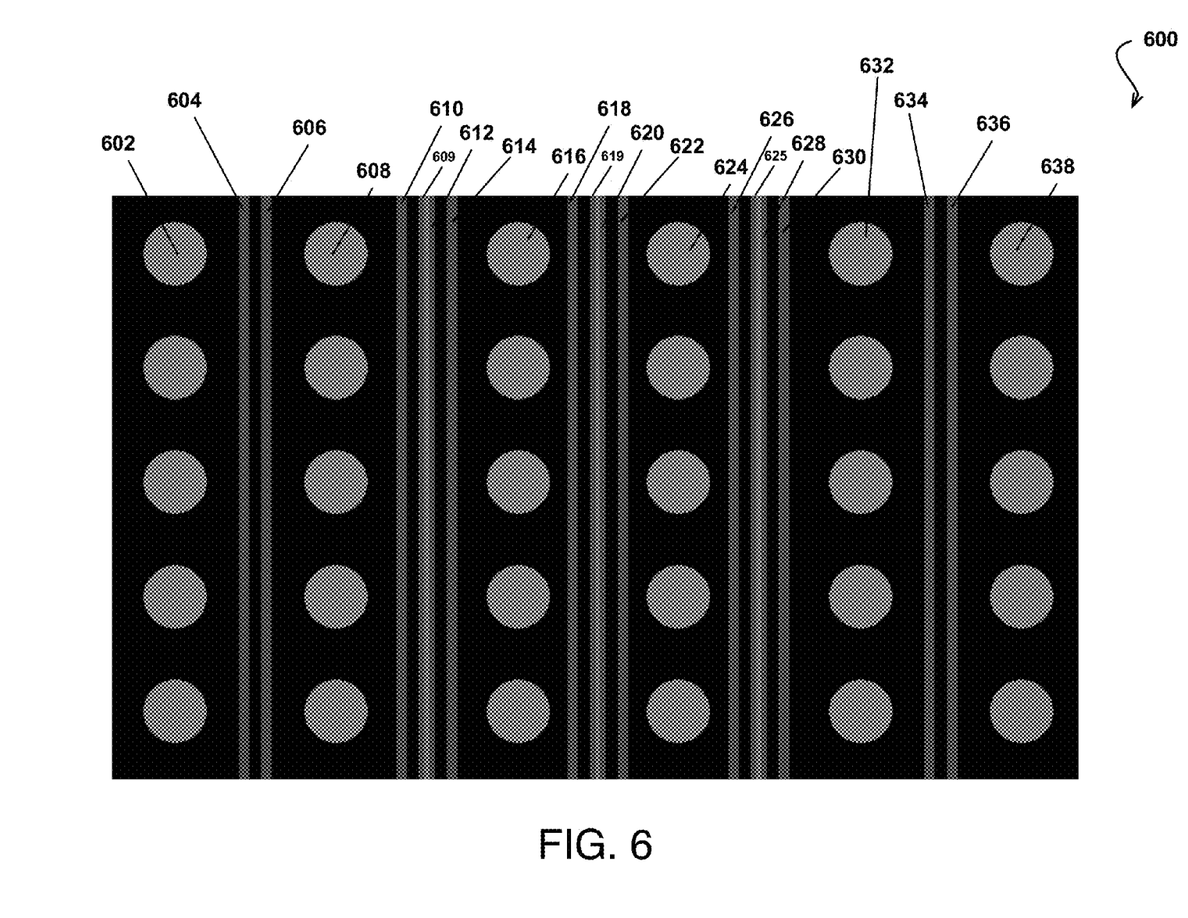
FIG. 6 illustrates an example PCB configuration with five respective routing channels including respective differential pairs that are arranged between vias.

FIG. 6 illustrates an example PCB configuration 600 with five respective routing channels including respective differential pairs that are arranged between vias on one of any dual stripe routing layer pairs of L3&L4, L6&L7 and L9 and L10. As shown, the example PCB configurations includes a via layout including vias 602, 608, 616 624, 632 and 638 (among a plurality of other vias). As referred to herein, a term "via" is an electrical connection between layers in a physical electronic circuit that goes through the plane of one or more adjacent layers. As shown in the example PCB configuration 600, the vias may be arranged to form a grid-like pattern, with a respective groups of vias between each respective routing channel.

A respective routing channel including one or more differential pairs may be required (e.g., based on a given industry or manufacturing standard(s)) to be a certain distance away from the vias as configured in the PCB configuration 600. A first routing channel at the most left side in FIG. 6 may include differential pair 604 and 606 in a first layer, and is not overlapping with any other differential pair in the example PCB configuration 600. Similarly, a fifth routing channel at the most right side in FIG. 6 may include differential pair 634 and 636 on a second layer, and is not overlapping with any other differential pair on any adjacent layer. The first and fifth routing channels are an example of using a dual stripline structure to minimize XTALK at the expense of routing density. More specifically, this is achieved by only routing one differential pair in each routing channel even though the dual stripline structure provides two routing layers.

By using the embodiments of the subject technology described herein, the three routing channels between the aforementioned first and fifth routing channels may fit a total of 6 pairs of differential pairs by using just the two aforementioned layers (and not increase an amount of layers used in order to increase the routing density) while maintaining an amount of XTALK to a minimum level (e.g., by reference to the positions 408 or 410 in FIG. 4). PCB trace 608 and 609 is one differential pair on one of the dual stripline routing layer and trace 612 and trace 614 is another differential pair on the second routing layer of the dual stripline routing layer in PCB configuration 600. Differential pair traces 608 & 609 and the traces 612 & 614 are purposely offset using embodiments of the subject technology. Similarly, differential pair traces 618 & 619 and differential pair traces 620 & 622 are arranged the same way in the third routing channel. The same for the differential pair trace 626 & 625 and differential pair traces 628 & 630 in the fourth channel. Without using embodiments of the subject technology, in one example, a given routing channel may suffer peak crosstalk by reference to the positions 402, 404 and 406 of FIG. 4.

PCB Offset Rules to Reduce XTALK

More simulations may be performed done for a PCB stackup with different ratios of H/D for the dual stripline structures. The offset may then be swept to find the optimal offset range so that the NEXT coefficient Kb is below the target 1%. The following discussion discusses approaches to minimize the NEXT.

The below table provides the optimal offset for different stackup which can generate minimal XTALK for two differential pairs (e.g., an optimal offset among the dual stripline pairs):

| Ratio of H/D | Trace width/ Spacing | D (mil) | Dielectric constant | Offset Range (mil) | Variation Tolerance (mil) | Target NEXT Kb |
|---|---|---|---|---|---|---|
| 1 | 5/12 | 5 | 4.3 | 10.6~11.0 | 3 | 1% |
| 2 | 5/12 | 5 | 4.3 | 10~13 | 3 | 1% |
| 3 | 5/12 | 5 | 4.3 | 11~13 | 3 | 1% |
| 4 | 5/12 | 5 | 4.3 | >10 | 3 | 1% |
| 5 | 5/12 | 5 | 4.3 | >7 | 3 | 1% |

In the above table, it can be seen that for H/D=1 case, the offset value range is too small (10.6 mil to 11.0 mil) to be done in the actual design. Hence it is very difficult to find any practical offset value which makes NEXT coefficient kb smaller than 1%. For a H/D=2 case, the optimal offset is 10 mil~13 mil with NEXT smaller than 1%. For a H/D=3 case, the optimal offset value is 11 mil~17 mil with NEXT smaller than 1%. For H/D=4 case, with offset is larger than 10 mil, NEXT is always smaller than 1% in this example. For H/D=5 case, when offset is larger than 7 mil, NEXT is always smaller than 1% in this example.

As one of ordinary skill in the art will readily recognize, the examples and technologies provided above are simply for clarity and explanation purposes, and can include many additional concepts and variations.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

What is claimed is:

1. A printed circuit board (PCB) comprising:
   a first reference plane;
   a first signal layer below the first reference plane;
   a second signal layer below the first signal layer;
   a second reference plane below the second signal layer;
   a first differential pair of conductive traces on the first signal layer; and
   a second differential pair of conductive traces on the second signal layer, the first differential pair arranged to interleave the second differential pair wherein an offset between a first trace of the second differential pair and a second trace of the first differential pair is smaller than an offset between the first trace of the second differential pair and a first trace of the first differential pair.

2. The PCB of claim 1, wherein the dielectric material has a first dielectric thickness between the first reference plane and a first trace of the first differential pair, the first dielectric thickness indicating a distance from the first trace to the first reference plane.

3. The PCB of claim 1, wherein the dielectric material has a second dielectric thickness between the first pair of conductive traces and the second pair of conductive traces.

4. The PCB of claim 1, wherein the first differential pair includes a first edge to edge width between a first trace and a second trace of the first differential pair.

5. The PCB of claim 4, wherein the second differential pair includes a second edge to edge width between a first trace and a second trace of the second differential pair.

6. The PCB of claim 5, wherein the first trace and the second trace of the first differential pair and the first trace and the second trace of the second differential pair each have a same trace width.

7. The PCB of claim 1, wherein pair to pair offset between the first differential pair and the second differential pair determines a crosstalk level between the first differential pair and the second differential pair.

8. The PCB of claim 7, wherein the first differential pair comprises an aggressor pair and the second differential pair comprises a victim pair.

9. The PCB of claim 8, wherein an amount of crosstalk noise on the victim pair is represented as the following notation:

$$\begin{bmatrix} Vp2 \\ Vn2 \end{bmatrix} = \begin{bmatrix} Kbp1p2 & Kbn1p2 \\ Kbp1n2 & Kbn1n2 \end{bmatrix} \begin{bmatrix} V \\ -V \end{bmatrix},$$

where Vp2 is an amount of crosstalk noise on a conductive trace P2 of the victim pair and Vn2 is an amount of crosstalk noise on a conductive trace N2 of the victim pair, where Kbp1p2 is a backwards crosstalk coefficient between a first trace P1 and a second trace P2, Kbn1p2 is a backwards crosstalk coefficient between a third trace N1 and the second trace P2, Kbp1n2 is a backwards crosstalk coefficient between the first trace P1 and a fourth trace N2, and Kbn1n2 is a backwards crosstalk coefficient between the third trace N1 and the fourth trace N2, wherein switching voltages on the first trace P1 and the third trace N1 have a value of V in amplitude and are in a 180 degree phase relationship.

10. A system comprising:
    a processor;
    an interface coupled to the processor, the interface including a PCB board, the PCB board comprising:
      a first reference plane;
      a first signal layer below the first reference plane;
      a second signal layer below the first signal layer;
      a second reference plane below the second signal layer;
      a first differential pair of conductive traces on the first signal layer; and
      a second differential pair of conductive traces on the second signal layer, the first differential pair arranged to interleave the second differential pair wherein an offset between a first trace of the second differential pair and a second trace of the first differential pair is smaller than an offset between the first trace of the second differential pair and a first trace of the first differential pair.

11. The system of claim 10, wherein the dielectric material has a first dielectric thickness between the first reference plane and a first trace of the first differential pair, the first dielectric thickness indicating a distance from the first trace to the first reference plane.

12. The system of claim 10, wherein the dielectric material has a second dielectric thickness between the first pair of conductive traces and the second pair of conductive traces.

13. The system of claim 10, wherein the first differential pair includes a first edge to edge width between a first trace and a second trace of the first differential pair.

14. The system of claim 13, wherein the second differential pair includes a second edge to edge width between a first trace and a second trace of the second differential pair.

15. The system of claim 14, wherein the first trace and the second trace of the first differential pair and the first trace and the second trace of the second differential pair each have a same trace width.

16. The system of claim 10, wherein a pair to pair offset between the first differential pair and the second differential pair determines a crosstalk level between the first differential pair and the second differential pair.

17. The system of claim 16, wherein the first differential pair comprises an aggressor pair and the second differential pair comprises a victim pair.

18. The system of claim 17, wherein an amount of crosstalk noise on the victim pair is represented as the following notation:

$$\begin{bmatrix} Vp2 \\ Vn2 \end{bmatrix} = \begin{bmatrix} Kbp1p2 & Kbn1p2 \\ Kbp1n2 & Kbn1n2 \end{bmatrix} \begin{bmatrix} V \\ -V \end{bmatrix},$$

where Vp2 is an amount of crosstalk noise on a conductive trace P2 of the victim pair and Vn2 is an amount of crosstalk noise on a conductive trace N2 of the victim pair, where Kbp1p2 is a backwards crosstalk coefficient between a first trace P1 and a second trace P2, Kbn1p2 is a backwards crosstalk coefficient between a third trace N1 and the second trace P2, Kbp1n2 is a backwards crosstalk coefficient between the first trace P1 and a fourth trace N2, and Kbn1n2 is a backwards crosstalk coefficient between the third trace N1 and the fourth trace N2, wherein switching voltages on the first trace P1 and the third trace N1 have a value of V in amplitude and are in a 180 degree phase relationship.

19. An apparatus comprising:
a printed circuit board (PCB), the PCB including:
   a first set of vias and a second set of vias;
   at least one routing channel between the first set of vias and the second set of vias, the at least one routing channel including at least a pair of overlapping conductive traces;
   a first reference plane;
   a first signal layer below the first reference plane;
   a second signal layer below the first signal layer;
   a second reference plane below the second signal layer;
   a first differential pair of conductive traces on the first signal layer; and
   a second differential pair of conductive traces on the second signal layer, the first differential pair arranged to interleave the second differential pair wherein an offset between a first trace of the second differential pair and a second trace of the first differential pair is smaller than an offset between the first trace of the second differential pair and a first trace of the first differential pair.

* * * * *